United States Patent [19]
Peng et al.

[11] Patent Number: 6,043,148
[45] Date of Patent: Mar. 28, 2000

[54] METHOD OF FABRICATING CONTACT PLUG

[75] Inventors: Yuan-Ching Peng; Lih-Juann Chen, both of Hsinchu; Yu-Ru Yang, I-Lan; Win-Yi Hsieh, Hsinchu; Yong-Fen Hsieh, Hsinchu Hsien, all of Taiwan

[73] Assignee: United Microelectronics Corp., HSin-Chu, Taiwan

[21] Appl. No.: 09/061,613

[22] Filed: Apr. 16, 1998

[30] Foreign Application Priority Data

Dec. 13, 1997 [TW] Taiwan ................... 86118830

[51] Int. Cl.⁷ .................. H01L 21/4763; H01L 21/44
[52] U.S. Cl. .................. 438/628; 438/643; 438/644; 438/648; 438/653; 438/654; 438/656; 438/660; 438/663; 438/672
[58] Field of Search .................. 438/627, 628, 438/643, 644, 648, 653, 654, 656, 660, 663, 672

[56] References Cited

U.S. PATENT DOCUMENTS 5,723,362  3/1998  Inoue et al. .................. 437/190
5,893,749  4/1999  Matumoto .................. 438/627

*Primary Examiner*—John F. Niebling
*Assistant Examiner*—Alexander G. Ghyka

[57] ABSTRACT

A method of fabricating a metal plug. On a semiconductor substrate comprising a MOS device, a dielectric layer, and a via hole penetrating though the dielectric layer, a conformal titanium layer is formed on the dielectric layer and the via hole. A low temperature annealing is formed in a nitrogen environment, so that a surface of the titanium layer is transformed into a first thin titanium nitride layer. A conformal second titanium nitride layer is formed on the first thin titanium nitride layer by using collimator sputtering. A metal layer is formed and etched back on the second titanium nitride layer to form a metal plug.

15 Claims, 6 Drawing Sheets

METHOD OF FABRICATING CONTACT PLUG

CROSS-REFERENCE TO RELATED APPLICATION

This application claims priority benefit of Taiwan application Ser. No. 86118830, filed Dec. 13, 1997, the full disclosure of which is incorporated herein by reference.

BACKGROUND OF THE INVENTION

1. Field of the Invention

The invention relates to a method of fabricating a semiconductor device, and more particularly to a method of fabricating a contact plug.

2. Description of the Related Art

As the integration of integrated circuits increases, the wafer cannot provides enough surface area for interconnects. To meet the requirement of interconnects for a metal-oxide-semiconductor (MOS) with a reduced dimension, multilevel metallization has become a popular way adapted in many integrated circuit devices. Normally, between a device and a metal layer, a dielectric layer is formed for isolation. The MOS electrodes and the metal layers are then electrically connected by a contact plug. However, to obtain good junction properties, such as adhesion, between the contact plug, the electrode and metal layers, a barrier layer is formed by good conductive material before the formation of the plug.

Titanium nitride is the most broadly used barrier material in a highly integrated circuit. To improve the Ohmic contact between metal and silicon, titanium nitride barrier is formed accompanied with a titanium layer as a form of titanium/titanium nitride (Ti/TiN) layer. For example, in the fabrication process of an alloy contact, the metal structure is assembled by titanium, titanium nitride, and alloy. Therefore, the work function of the contact interface is decreased, and the spike and electromigration are suppressed.

In a conventional method of fabricating a barrier layer and an interconnect, a titanium layer is formed first. Using physical vapor deposition (PVD), a titanium nitride layer having a thickness of about 800 Å to 1200 Å is formed as a barrier layer on the titanium layer. A refractory and well conductive metal, for example, a tungsten layer, is formed on the titanium barrier layer. After etch back, a plug formed of the metal layer for interconnecting metal layers is formed. The surface of the device is then cleaned for the another metal wiring layout.

The above conventional method is described in detail as follows.

Referring to FIG. 1A, on a substrate 100 comprising a MOS device, a dielectric layer 102, for example, a one-layered or two-layered spin-on-glass (SOG) sandwich type dielectric layer, is formed. The sandwich type dielectric layer prevents the formation of voids during by chemical vapor deposition (CVD).

In FIG. 1B, a photo-resist layer is formed and patterned on the dielectric layer. The dielectric layer 102 is etched to form a via hole 104, so that a gate cap, for example, titanium silicide or aluminum titanium, of the MOS is exposed within the via hole 104.

Referring to FIG. 1C, to improve the adhesion between the subsequently formed tungsten plug and the gate cap, a titanium nitride or titanium tungsten layer is formed. In addition to improve the adhesion, the titanium nitride or titanium tungsten layer is also used as an etch stop due to the difference of plasma spectrum between tungsten and titanium nitride or titanium tungsten. In practical application, titanium nitride is accompanied with titanium as a form of Ti/TiN. Therefore, before the formation of the tungsten plug, a titanium layer 106 is formed as a glue layer.

In FIG. 1D, a titanium nitride layer 108 having a thickness of about 800 Å to 1200 Å is formed, for example, by PVD. Normally, by PVD, a titanium layer is formed by DC magnetron sputtering. The titanium layer is then displaced in an environment containing nitrogen or ammonia. By rapid thermal process (RTP), the titanium is transformed into titanium nitride. Or a reactive sputtering is used to deposit titanium nitride. A mixture of argon and nitrogen is used as a reactive gas. Through ion bombardment, the titanium sputtered from a titanium target by ion sputtering is reacted with the reactive gas to form a titanium nitride layer.

In FIG. 1E, a refractory and well conductive metal layer 110, for example, a tungsten layer, is formed on the titanium nitride layer 108.

In FIG. 1F, apart of the metal layer 110 is removed to form a metal plug within the via hole 104. If tungsten is used for forming the plug, a gas containing carbon fluoride and oxygen, nitrogen fluoride and oxygen, or sulfur fluoride is used as the etchant. The tungsten is etched back with the titanium nitride layer 106 as an etch stop to form a tungsten plug.

In the conventional process mentioned above, if the titanium nitride barrier layer is formed by DC magnetron sputtering, titanium is reacted with the reacting gas in a high temperature. Since the step coverage provided by sputtering is limited, most of the titanium nitride is deposited on the surface of the via hole. Therefore, an overhand is formed as shown in FIG. 1G. As the integration of device increases, the problem becomes more and more serious. A sputtering technique of collimator is developed to improve the step coverage. The sputtering technique of collimator is used in a design rule of or under 0.25 μm. However, though wide angle sputtering is avoided to improve the step coverage by using the collimator deposition, the titanium nitride deposition on the side wall of the via hole becomes very thin as shown in FIG. 1H. The adhesion between the subsequently formed tungsten plug and the titanium nitride barrier is degraded. Consequently, while forming tungsten plug, the reacting gas, tungsten hexafluoride, is reacted with the side wall of the via hole to form a titanium tetrafluoride (TiF$_4$). The electrical characteristics are thus altered.

SUMMARY OF THE INVENTION

It is therefore an object of the invention to provide a method of fabricating a metal plug. A titanium nitride barrier layer is formed by using collimator sputtering process. The step coverage is improved, and furthermore, the problem of forming the titanium nitride layer on the side wall of the via hole is solved.

To achieve these objects and advantages and in accordance with the purpose of the invention, as embodied and broadly described herein, the invention is directed towards a method of fabricating a metal plug. On a semiconductor substrate comprising a MOS device, a dielectric layer, and a via hole penetrating through the dielectric layer, a conformal titanium layer is formed on the dielectric layer and the via hole. A low temperature annealing is formed in a nitrogen environment, so that a surface of the titanium layer is transformed into a first thin titanium nitride layer. A conformal second titanium nitride layer is formed on the first thin titanium nitride layer by using collimator sputtering. A metal layer is formed and etched back on the second titanium nitride layer to form a metal plug.

It is to be understood that both the foregoing general description and the following detailed description are exemplary and explanatory only and are not restrictive of the invention, as claimed.

DESCRIPTION OF THE PREFERRED EMBODIMENTS

Figure 1A:
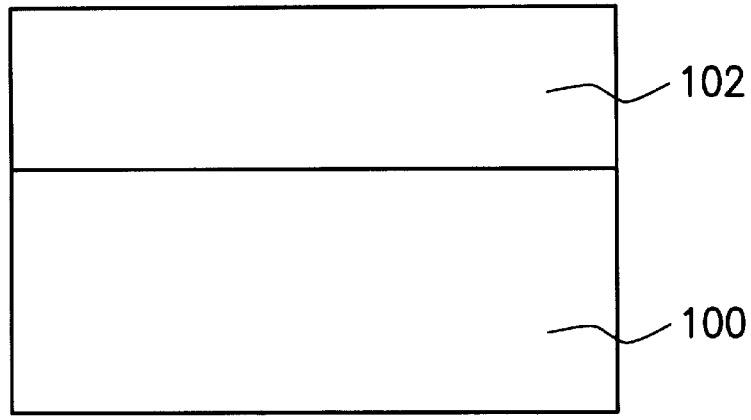
FIG. 1A to FIG. 1H show a conventional method of fabricating a metal interconnect in a semiconductor device.
Figure 1B:
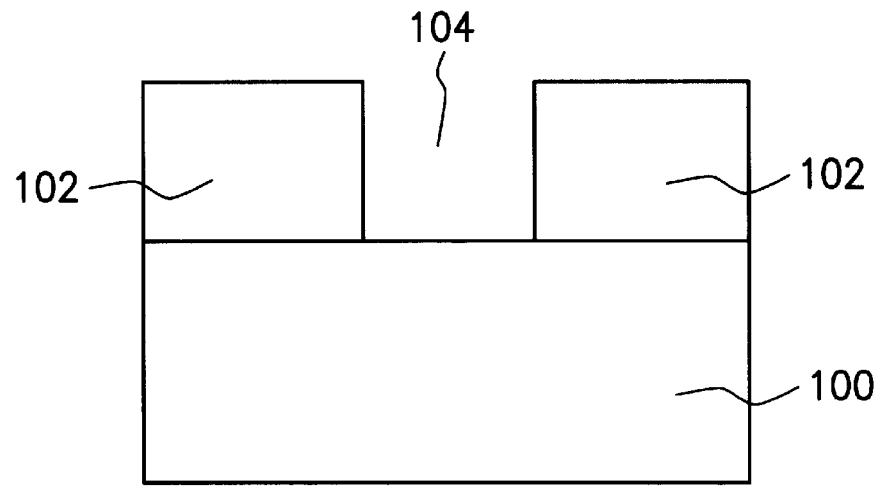
Figure 1C:
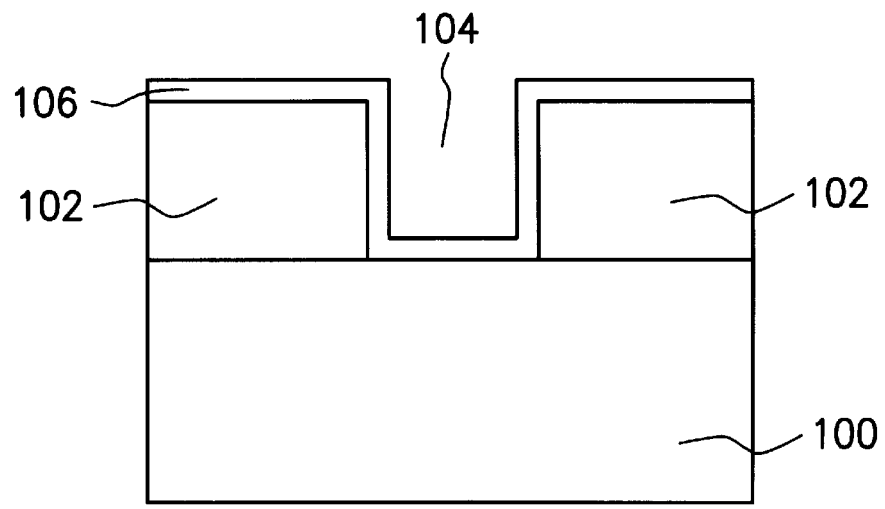
Figure 1D:
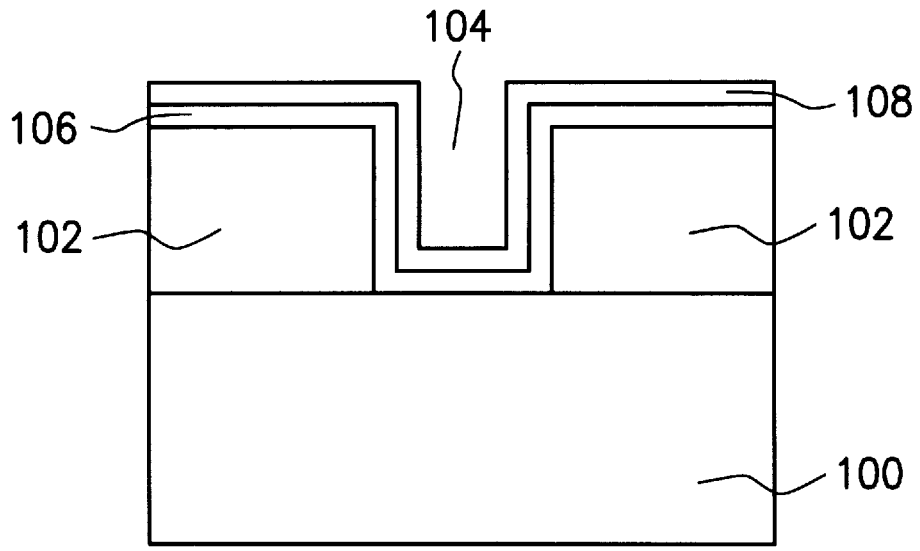
Figure 1E:
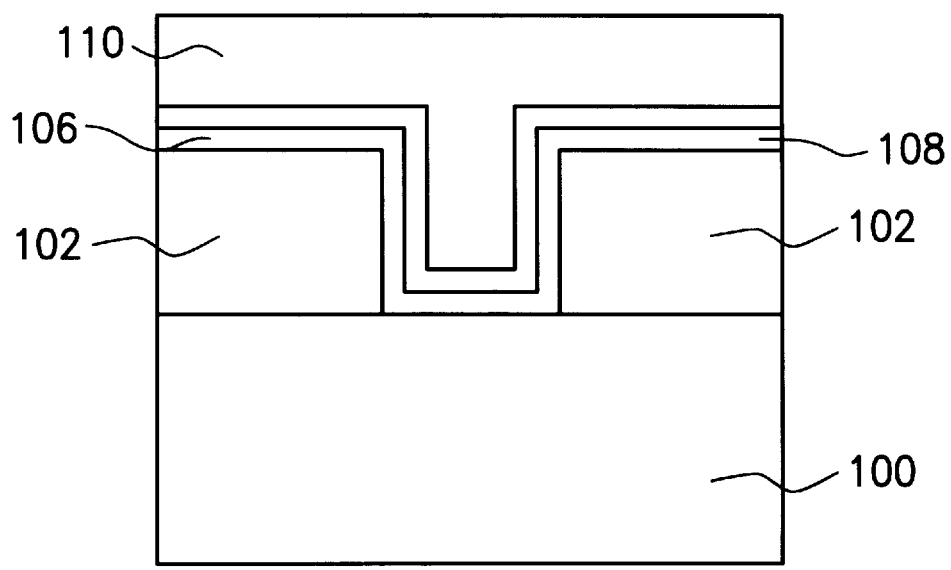
Figure 1F:
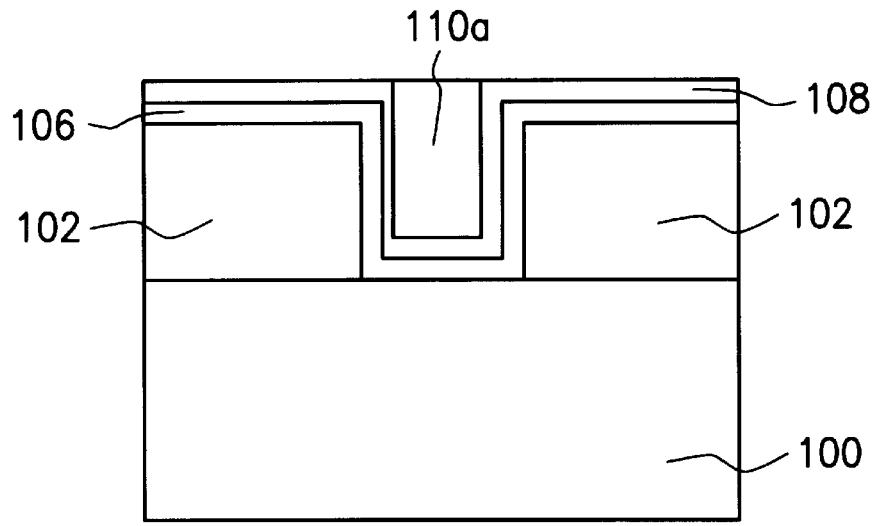
Figure 1G:
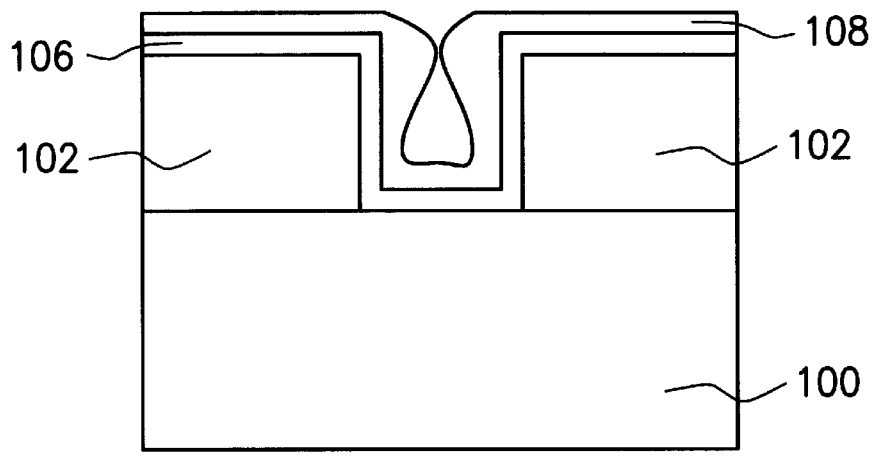
Figure 1H:
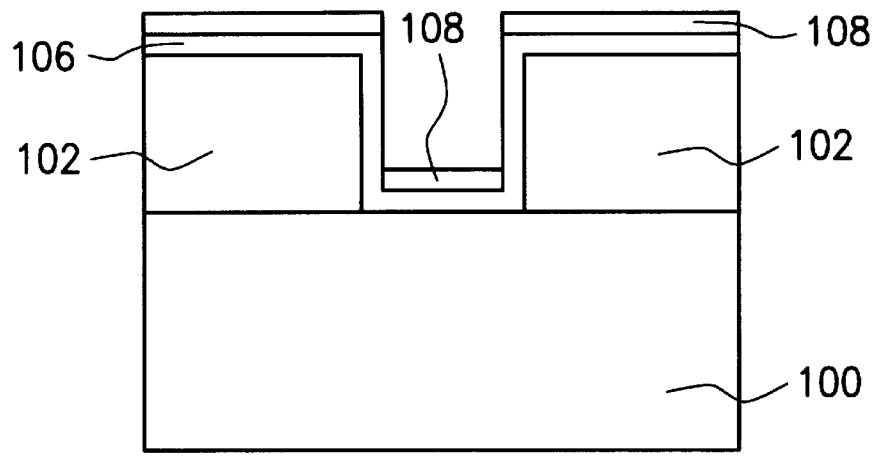
Figure 2A:
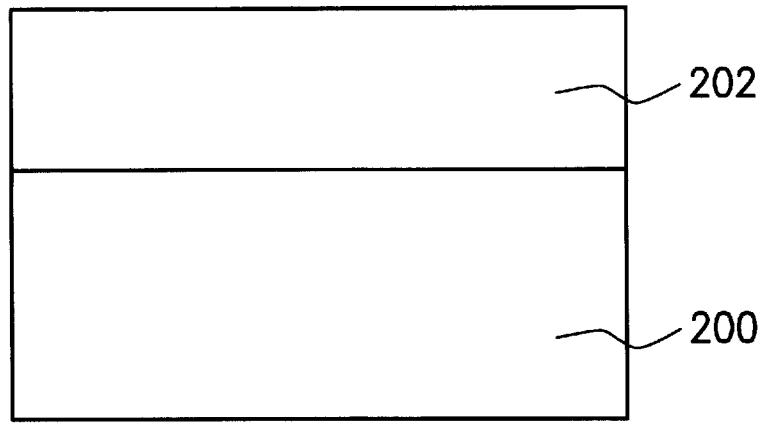
FIG. 2A to FIG. 2G show a method of fabricating a metal interconnect in a semiconductor device in a preferred embodiment according to the invention.

In FIG. 2A, on a semiconductor substrate 200 comprising a MOS device and a first metal layer, a dielectric layer 202 is formed. The dielectric layer 202 includes, for example, a one-layered or two-layered SOG sandwich type dielectric layer. The sandwich type dielectric layer prevents the formation of voids during forming the dielectric layer by CVD. To form the sandwich type dielectric layer, an oxide layer is formed by plasma enhanced CVD (PECVD) with introducing tetra-ethyl-ortho-silicate (TEOS) as a precursor. An SOG layer is formed on the oxide layer. After bake and curing, a dielectric layer is formed on the SOG layer.

Figure 2B:
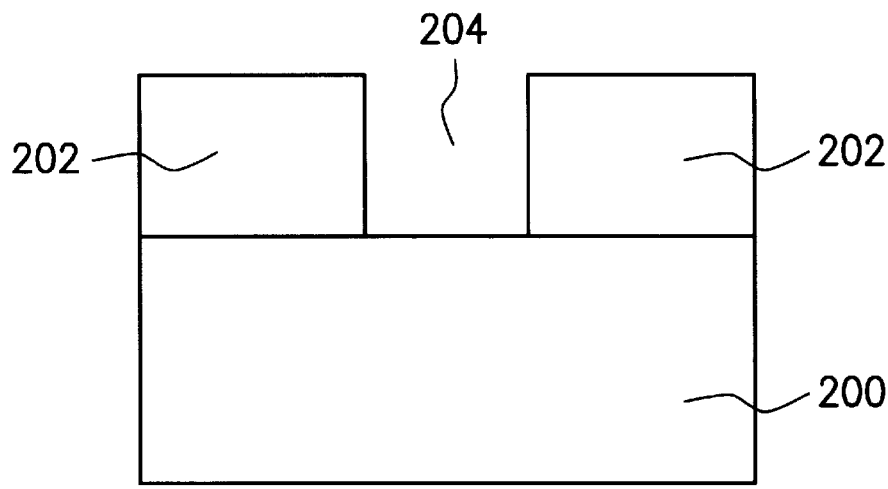

In FIG. 2B, a photo-resist layer is formed and patterned on the dielectric layer 202. Using photolithography and etching, the dielectric layer 202 is defined to form a via hole 204, so that the gate and the metal layer as a connecting channel are exposed within the via hole 204.

Figure 2C:
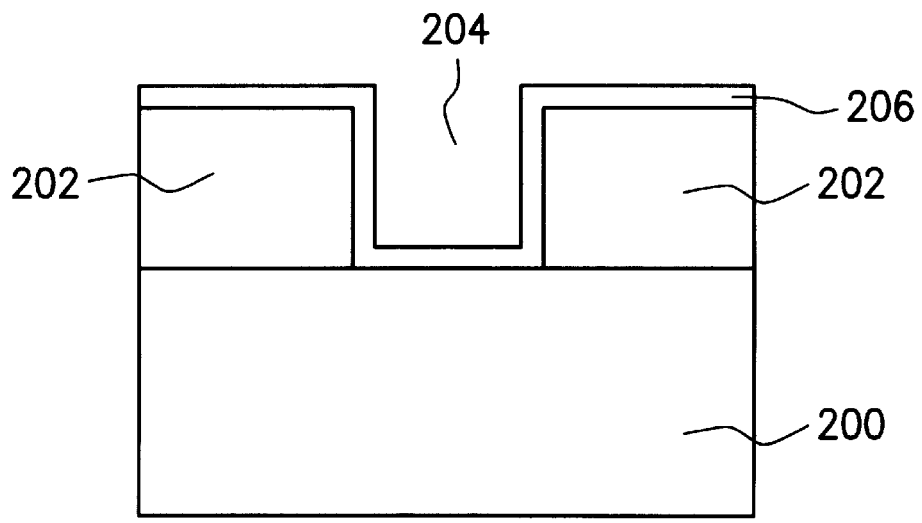

In FIG. 2C, to improve the adhesion between the gate and the metal layer and the subsequently formed metal plug, a titanium nitride or a titanium tungsten layer is formed. In addition to improve the adhesion, the titanium nitride or titanium tungsten layer is also used as an etch stop due to the difference of plasma spectrum between tungsten and titanium nitride or titanium tungsten. In practical application, titanium nitride is accompanied with titanium as a form of Ti/TiN. Therefore, before the formation of the metal plug, a titanium layer 206 formed as a glue layer. A conformal titanium glue layer 206 is formed on the surface of the via hole 204 and the dielectric layer 202. A preferable titanium glue layer 206 is formed with a thickness of about 200 Å to 1500 Å by DC magnetron sputtering in an argon environment.

Figure 2D:
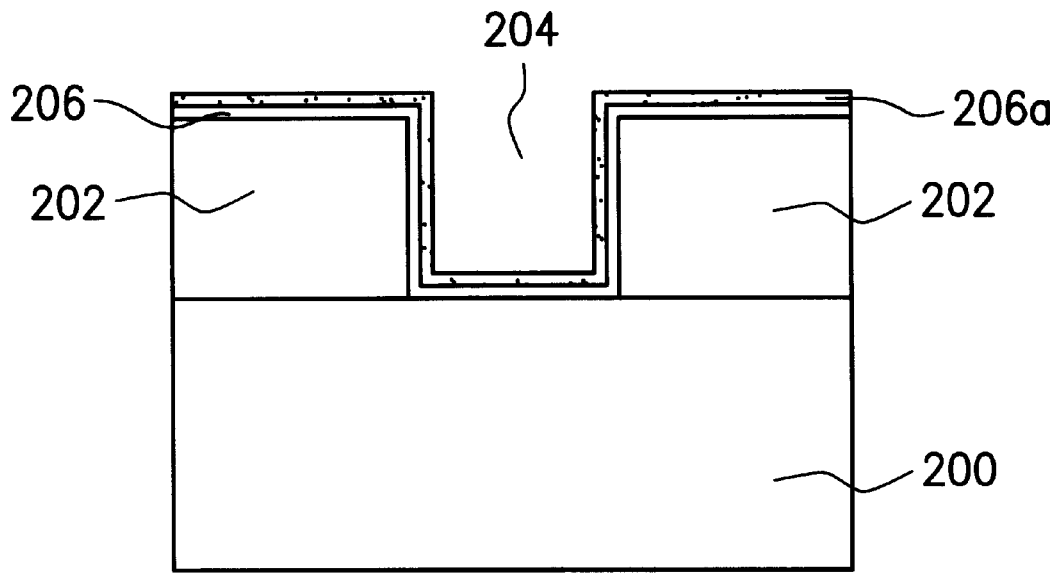

In FIG. 2D, a low temperature annealing is performed in a nitrogen environment. The surface of the titanium glue layer 206 is transformed to a thin titanium nitride layer 206a. The low temperature annealing is preferably performed at about 350° C. to 450° C. for about 10 min. Since the temperature of the annealing process is not high, a gate cap of the gate is not damaged during the annealing process. Moreover, the side wall of the via hole is covered and protected by the thin titanium nitride layer 206a. In the subsequent process for forming a barrier layer, deposition of collimator can be used to improve the step coverage without causing the reaction between the reacting gas and the side wall of the via hole.

Figure 2E:
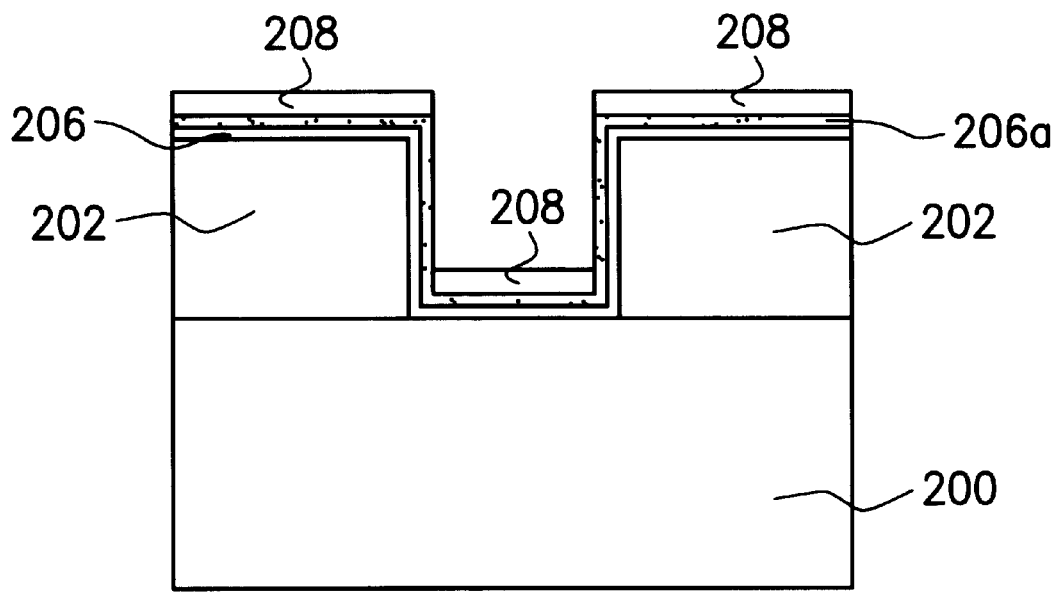

In FIG. 2E, a barrier layer, for example, a titanium nitride layer having a thickness of about 800 Å to 1200 Å formed by PVD, is formed on the thin titanium nitride layer 206a.

A preferred method of fabricating the titanium nitride layer is reactive sputtering. A mixture of argon and nitrogen is used as a reactive gas. Through ion bombardment, the titanium sputtered from a titanium target by ion sputtering is reacted with the reactive gas to form a titanium nitride layer.

Figure 2F:
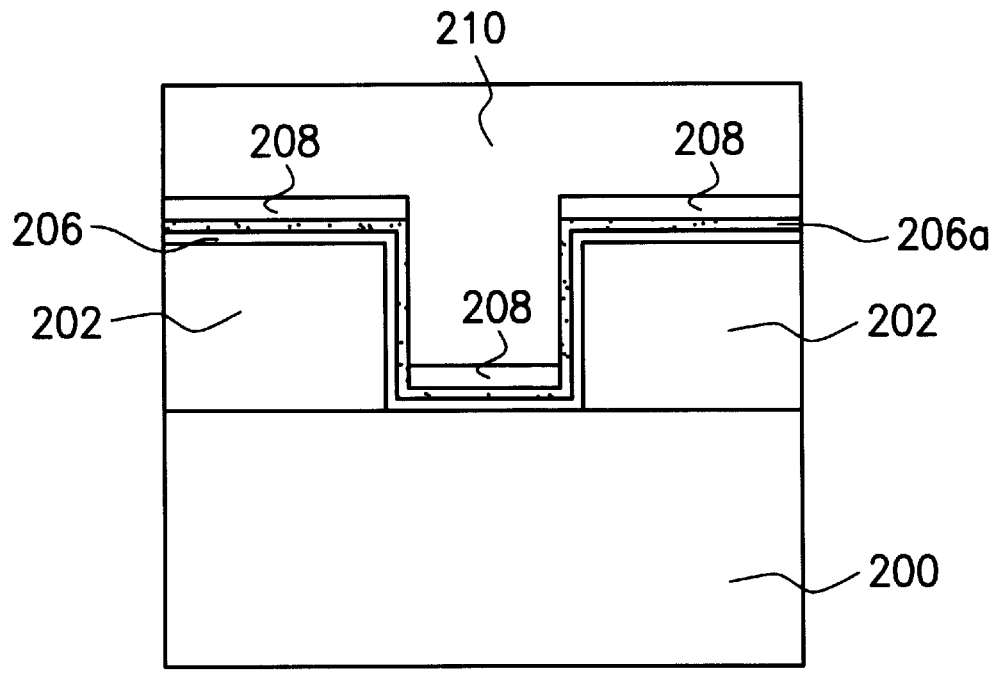

In FIG. 2F, a refractory and well conductive metal layer 210, for example, a tungsten layer, is formed on the barrier layer 208a, so that the via hole 204 is filled with the metal layer 210. If a tungsten layer is formed, obtain a good adhesion between the tungsten layer and other material, two steps are performed with tungsten hexafluoride as a reacting gas at about 300° C. to 550° C. under 1 Torr to 100 Torr. A thinner tungsten nucleation layer is formed on the barrier layer 208a. A tungsten layer having a thickness of about 5000 Å to 10000 Å is then formed on the nucleation layer.

Figure 2G:
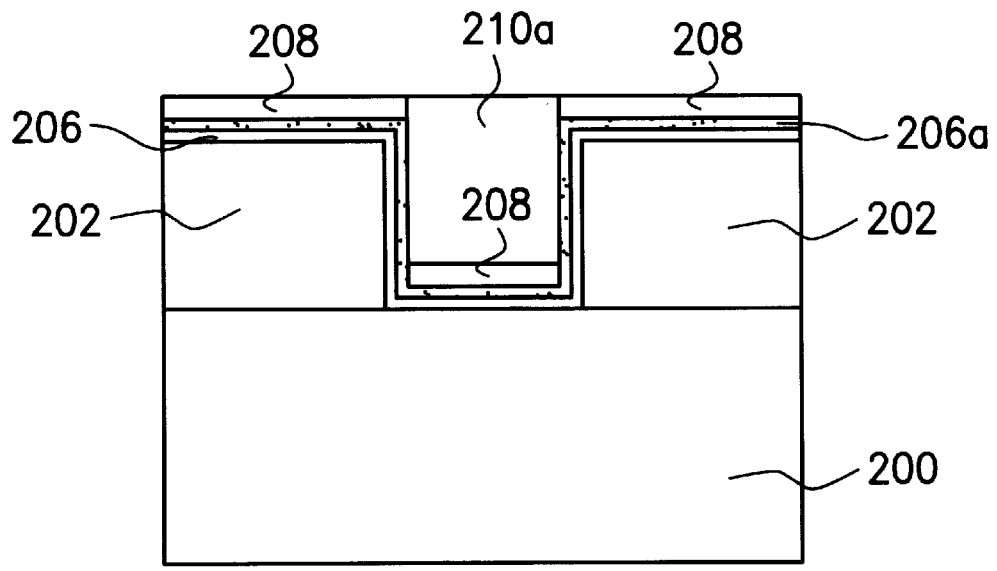

In FIG. 2G, a part of the metal layer 210 is removed to form a metal plug 210a within the via hole 204. If tungsten is used for forming the plug, a gas containing carbon fluoride and oxygen, nitrogen fluoride and oxygen, or sulfur fluoride is used as the etchant. The tungsten is etched back with the titanium nitride layer 206a as an etch stop to form a tungsten plug.

After the formation of the metal plug, the subsequent processes such as deposition, photolithography, and etching, are perform to form another metal layer. The interconnection of the second level is then formed.

It is therefore one of the characteristics of the invention that a low temperature annealing is performed before the deposition of a titanium nitride layer by collimator sputtering. The low temperature annealing is performed in a nitrogen environment. The surface of the titanium layer on the via hole is transformed into a thin titanium nitride layer. The disadvantage that the titanium nitride layer is difficult to form on the side wall of the via hole is overcome. The adhesion between the metal plug and the dielectric layer is improved, and the Ohmic contact is enhanced. On the other hand, by using collimator sputtering, a good step coverage is obtained. With the formation of the thin titanium nitride layer by a low temperature annealing, the MOS device is not damaged, and the reaction between the reacting gas of forming the metal plug and the side wall of the via hole is prevented.

Moreover, after the formation of the glue layer, the low temperature annealing is performed, and the titanium nitride layer is formed in the same chamber by collimator sputtering. The fabricating cost is not increased, but the quality of device is improved.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a metal plug, wherein a semiconductor substrate comprising a MOS device, a dielectric layer, and a via hole penetrating though the dielectric layer is provided, comprising:

forming a conformal glue layer on the dielectric layer and the via hole;

performing a low temperature annealing, wherein the low temperature annealing is performed in a nitrogen environment at about 350° C. to 450° C. for about 10 min;

after the step of performing the low temperature annealing, forming a conformal barrier layer above the glue layer by using collimator sputtering; and forming and etching back a metal layer on the barrier layer to form a metal plug.

2. The method according to claim 1, wherein the glue layer includes a titanium layer.

3. The method according to claim 2, wherein the glue layer is formed by DC magnetron sputtering.

4. The method according to claim 1, wherein after the low temperature annealing, an additional thin barrier layer is formed on a surface of the glue layer.

5. The method according to claim 1, wherein the barrier layer includes a titanium nitride layer.

6. The method according to claim 1, wherein the barrier layer is formed by reactive sputtering.

7. The method according to claim 1, wherein the metal layer includes a tungsten layer.

8. The method according to claim 7, wherein the metal plug includes a tungsten plug.

9. The method according to claim 1, the metal layer is etched back by an anisostropic etching.

10. A method of fabricating a metal plug, wherein a semiconductor substrate comprising a MOS device, a dielectric layer, and a via hole penetrating though the dielectric layer is provided, comprising:

forming a conformal titanium layer on the dielectric layer and the via hole;

performing a low temperature annealing in a nitrogen environment, so that a surface of the titanium layer is transformed into a first thin titanium nitride layer, wherein the low temperature annealing is performed in a nitrogen environment at about 350° C. to 450° C. for about 10 min;

after the step of performing the low temperature annealing, forming a conformal second titanium nitride layer above the first thin titanium nitride layer by using collimator sputtering; and forming and etching back a metal layer on the second titanium nitride layer to form a metal plug.

11. The method according to claim 10, wherein the titanium layer is formed by DC magnetron sputtering.

12. The method according to claim 10, wherein the second titanium nitride layer is formed by reactive sputtering.

13. The method according to claim 1, wherein the metal layer includes a tungsten layer.

14. The method according to claim 13, wherein the metal plug includes a tungsten plug.

15. The method according to claim 1, the metal layer is etched back by an anisostropic etching.

* * * * *